United States Patent
Coupez et al.

(10) Patent No.: US 9,941,568 B2
(45) Date of Patent: Apr. 10, 2018

(54) TRANSITION DEVICE BETWEEN A PRINTED TRANSMISSION LINE AND A DIELECTRIC WAVEGUIDE, WHERE A CAVITY THAT INCREASES IN WIDTH AND HEIGHT IS FORMED IN THE WAVEGUIDE

(71) Applicant: INSTITUT MINES TELECOM/TELECOM BRETAGNE, Brest (FR)

(72) Inventors: Jean-Philippe Coupez, Brest (FR); Sylvain Chenu, Rennes (FR)

(73) Assignee: INSTITUT MINES TELECOM/TELECOM BRETAGNE, Brest (FR)

( * ) Notice: Subject to any disclaimer, the term of this patent is extended or adjusted under 35 U.S.C. 154(b) by 0 days.

(21) Appl. No.: 15/023,113

(22) PCT Filed: Sep. 19, 2014

(86) PCT No.: PCT/EP2014/070055
§ 371 (c)(1),
(2) Date: Mar. 18, 2016

(87) PCT Pub. No.: WO2015/040192
PCT Pub. Date: Mar. 26, 2015

(65) Prior Publication Data
US 2016/0233568 A1    Aug. 11, 2016

(30) Foreign Application Priority Data
Sep. 19, 2013    (FR) ..................... 13 59045

(51) Int. Cl.
*H01P 5/107*    (2006.01)
*H01P 5/08*    (2006.01)
*H05K 1/02*    (2006.01)

(52) U.S. Cl.
CPC ............ *H01P 5/107* (2013.01); *H01P 5/08* (2013.01); *H01P 5/087* (2013.01); *H05K 1/0243* (2013.01)

(58) Field of Classification Search
CPC ............................ H01P 5/107; H01P 5/087
(Continued)

(56) References Cited

U.S. PATENT DOCUMENTS 2,979,676 A    4/1961    Rueger
3,146,410 A    8/1964    Butler
(Continued)

FOREIGN PATENT DOCUMENTS

| FR | 2849720 A1 | 7/2004 |
| JP | 2002-344212 A | 11/2002 |
| WO | 20100130293 A1 | 11/2010 |

OTHER PUBLICATIONS

International Search Report for PCT/EP2014/070055, dated Nov. 24, 2014.
Written Opinion for PCT/EP2014/070055, dated Nov. 24, 2014.

*Primary Examiner* — Benny Lee
(74) *Attorney, Agent, or Firm* — Meagher Emanuel Laks Goldberg & Liao, LLP (57) ABSTRACT

The invention relates to a transition device between a printed transmission line on a dielectric substrate and a rectangular waveguide including a front face forming an inlet of the waveguide, a rear face parallel to the front face and forming an outlet of the waveguide, a lower face, an upper face parallel to the lower face, the upper and lower faces extending between the front and rear faces, the waveguide being a block of dielectric material whereof the faces are fully metallized except for the front face and the rear face, the transition device including: a three-dimensional cavity formed in the volume of the waveguide between the inlet of the waveguide, further forming the inlet of the cavity, and
(Continued)

the rear face widening, the cavity being at an inlet height of the lower face of the waveguide and ending at a distance from the inlet of the cavity at an outlet height greater than the inlet height; an electrical connection extending from the transmission line along the front face of the waveguide up to the inlet of the three-dimensional cavity.

9 Claims, 6 Drawing Sheets

(58) Field of Classification Search
USPC .......................................................... 333/26
See application file for complete search history.

(56) References Cited

U.S. PATENT DOCUMENTS

| | | |
|---|---|---|
| 3,265,995 A * | 8/1966 | Hamasaki ............... H01P 5/107 333/21 R |
| 3,731,508 A | 5/1973 | Ito et al. |
| 3,932,823 A | 1/1976 | Lavedan et al. |
| 4,260,964 A | 4/1981 | Saul |
| 5,793,263 A | 8/1998 | Pozar |
| 6,002,305 A | 12/1999 | Sanford et al. |
| 6,265,950 B1 | 7/2001 | Schmidt et al. |
| 6,794,950 B2 | 9/2004 | du Toit et al. |
| 6,977,560 B2 | 12/2005 | Itoh et al. |
| 7,132,905 B2 | 11/2006 | Sano |
| 7,382,212 B2 | 6/2008 | Lo Hine Tong et al. |
| 7,746,191 B2 | 6/2010 | Tong et al. |
| 8,022,784 B2 | 9/2011 | Lee et al. |
| 8,305,280 B2 | 11/2012 | Brown et al. |
| 8,368,482 B2 | 2/2013 | Sano |
| 2002/0047038 A1 | 4/2002 | Sangawa et al. |
| 2011/0267153 A1 | 11/2011 | Hirota et al. |
| 2012/0206213 A1* | 8/2012 | Kojima et al. .......... H01P 5/107 333/26 |

* cited by examiner

TRANSITION DEVICE BETWEEN A PRINTED TRANSMISSION LINE AND A DIELECTRIC WAVEGUIDE, WHERE A CAVITY THAT INCREASES IN WIDTH AND HEIGHT IS FORMED IN THE WAVEGUIDE

GENERAL TECHNICAL FIELD

The invention relates to a transition from a transmission line to a waveguide and more particularly a transition between a printed transmission line on a substrate and a rectangular waveguide.

PRIOR ART

Several types of transitions are known between a printed transmission line on a substrate and a rectangular waveguide.

A first type of transition relies on configurations based on a perpendicular configuration between the plane containing the substrate and the longitudinal axis of the waveguide. In this case, the substrate supporting the transmission line completely blocks off the end of the waveguide and the electromagnetic coupling between this line and this guide is then provided either by:
- One or more recesses arranged in the ground plane or planes of the printed circuit, which consist of open windows toward the guide, e.g. in patent document US 2011/0267153;
- One or more radiating elements, of the patch antenna type, for example, oriented to radiate toward the interior of the guide, as illustrated notably in patent document U.S. Pat. No. 5,793,263;
- An element equivalent to an excitation probe, positioned at the inlet of the guide, as, for example, in patent document U.S. Pat. No. 8,022,784;
- Or any possible combination of these elements, or even with other elements such as cavities or "ridges" inserted into the waveguide, as, for example, in patent document U.S. Pat. No. 6,794,950.

One problem with this first type of transition is that the perpendicular geometry between the substrate and the guide, and the various coupling means used lead to serious problems with regard to the ease of assembly of such a structure, in particular regarding the fine control of the positioning between the various elements constituting the transition.

A second type of transition consists of configurations where:
- either the substrate is applied directly onto one of the lateral faces of the waveguide, typically its lower or upper face;
- or the guide is itself transferred onto the surface of a printed circuit.

In all cases, the coupling of the printed transmission line to the waveguide is produced from patterns inscribed together on the substrate and the lateral face of the guide and positioned opposite each other. These patterns may be equivalent to slots or to electrodes, as, for example, in patent documents U.S. Pat. Nos. 6,977,560, 8,368,482, WO 2010/130293 and U.S. Pat. No. 7,132,905. All these solutions therefore need to directly etch the coupling patterns on the waveguide and align them or space them very precisely with the patterns inscribed on the printed circuit, hence leading to real difficulties in production and assembly.

A third type of transition corresponds to solutions where the coupling between the transmission line and the waveguide is obtained by a probe or antenna system connected to the end of the line and plunging inside the guide. This probe or antenna is then combined with other elements produced within the guide, such as cavities or ridges. Patent documents U.S. Pat. Nos. 3,146,410, 6,002,305 and 7,746,191 are some examples of this. The main drawback to this type transition is based on the need to physically insert a plunger in the guide, with all the associated difficulties of production, assembly and positioning.

A fourth type of transition is also based on a principle of insertion inside the waveguide of a substrate on which the transmission line is printed. The substrate is then either partially inserted into the guide from its open end, or is completely inserted into the plane E of this guide. The printed patterns on the substrate are either of the antenna type or of the taper type (transition produced on the substrate between, for example, a microstrip line and a slot line). Patent documents U.S. Pat. Nos. 3,732,508, 4,260,964 and 8,305,280 describe examples of such a transition. As for the third type of transition, the major difficulty with this family of solutions is the insertion of all or part of the substrate supporting the printed patterns into the waveguide.

Finally, a fifth and final type of transition is based on the use of a narrow ridge or "tapered" structure, most often produced inside an air waveguide, in electrical contact with the end of a transmission line etched on a substrate. Patent documents U.S. Pat. No. 6,265,950 and JP 2002344212 illustrate two examples. For this type of ridge transition, an alternative solution, where the guide and the substrate are then produced collectively in the same dielectric material, is described in patent document U.S. Pat. No. 7,382,212. In patent documents U.S. Pat. No. 6,265,950 and JP 2002344212, the transition requires a precise overlapping of the ridge and the end of the line and the ridge is produced in the form of an excrescence extending into the internal volume of the air waveguide. In patent document U.S. Pat. No. 7,382,212, the uniqueness of the dielectric material for the joint production of the guide and the substrate does not allow combining such a transition with a printed circuit produced on any other dielectric substrate.

Taking into account the various known types of transitions there is a real need to simplify the production of a transition and to facilitate its surface transfer onto any type of printed circuit.

SUMMARY OF THE INVENTION

The invention meets the above-mentioned need and provides a transition device between a printed transmission line on a dielectric substrate and a rectangular waveguide including a front face forming an inlet of the waveguide, a rear face parallel to the front face and forming an outlet of the waveguide, a lower face, an upper face parallel to the lower face, the upper and lower faces extending between the front and rear faces, the waveguide being a block of dielectric material whereof the faces are fully metalized except for the front face and the rear face, the transition device including:
a three-dimensional cavity formed in the volume of the waveguide between the inlet of the waveguide, further forming the inlet of the cavity, and widening from the inlet to the rear face, the cavity being at an inlet height of the lower face of the waveguide and ending at a distance from the inlet of the cavity at an outlet height greater than the inlet height;
an electrical connection extending from the transmission line along the front face of the waveguide up to the inlet of the three-dimensional cavity.

The invention is advantageously completed by the following features, taken singly or in any one of their technically possible combinations:

the cavity presents an inlet width and an outlet width greater than the inlet width so that the widening of the cavity results in the height/width pair increasing along the waveguide;

the dielectric substrate includes a front face including a conductive deposit forming a ground plane, and a rear face parallel to the front face on which the transmission line is printed, the waveguide being disposed on the ground plane, the dielectric substrate including a recess configured for bringing the electrical connection to the inlet of the cavity, the waveguide including on its lower face a local area at the level of the electrical connection devoid of metalization in order to prevent any electrical contact between the electrical connection and the lower face of the waveguide;

the dielectric substrate includes a front face including a conductive deposit forming a ground plane, and a rear face parallel to the front face on which the transmission line is printed, the waveguide being disposed on the rear face, the lower face of the waveguide being connected to the ground plane via a plurality of metalized vias traversing the dielectric substrate, the lower face of the waveguide including a local area at the level of the electrical connection devoid of metalization in order to prevent any electrical contact between the electrical connection and the lower face of the waveguide;

the dielectric substrate includes a front face on which are printed the transmission line and a conductive deposit forming a ground plane in contact with the lower face of the waveguide, the ground plane and the transmission line being coplanar, the electrical connection being connected to the end of the transmission line, the lower face of the waveguide including a local area at the level of the electrical connection devoid of metalization in order to prevent any electrical contact between the electrical connection and the lower face of the waveguide;

a metal support on which the waveguide is disposed, the lower face of the waveguide being connected to said metal support, a metal support on which the dielectric substrate is also disposed, the conductive element being connected to the inlet of the waveguide;

the three-dimensional cavity includes a U-shaped inlet profile at the inlet of the waveguide;

the three-dimensional cavity includes an inlet profile with oblique linear edges, concave edges, convex edges, and sinuous edges;

the three-dimensional cavity presents a linear, concave, convex, sinuous, widening profile, said widening profile being characteristic of the variation in the width of the cavity between the inlet width and the outlet width;

the three-dimensional cavity includes a linear, concave, convex, sinuous, lateral profile, said lateral profile being characteristic of the variation in the height of the cavity between the inlet height and the outlet height.

Compared to the known transition devices, the transition device of the invention facilitates both the production of the device and the surface transfer thereof onto any type of printed circuit.

In particular, the coupling between the transmission line and the waveguide, by a simple direct electrical connection between the two elements, makes this solution particularly robust and not very sensitive to technological and assembly deviations.

Other advantages provided by the device of the invention are as follows:

simplicity of production of the three-dimensional cavity inscribed in the volume of the waveguide, by machining or molding of the raw dielectric material, then overall external metalization of the structure, except at the level of the two transverse sections at the ends of the guide and at the level of the non-metalized local area arranged in the lower face of the guide;

multiple parameters of freedom in the design of such a transition structure, in particular at the level of the choice of the geometry of the three-dimensional surface of the cavity and the dimensions thereof.

In addition, the invention also leads to good electrical performance, notably regarding the bandwidth of the device, while having a structure of a relatively compact size.

BRIEF DESCRIPTION OF THE DRAWINGS

Other features, purposes and advantages of the invention will emerge from the following purely illustrative and non-restrictive description, which must be read with reference to the accompanying drawings in which.

In all the figures similar elements bear identical references.

DETAILED DESCRIPTION OF THE INVENTION

Figure 1:
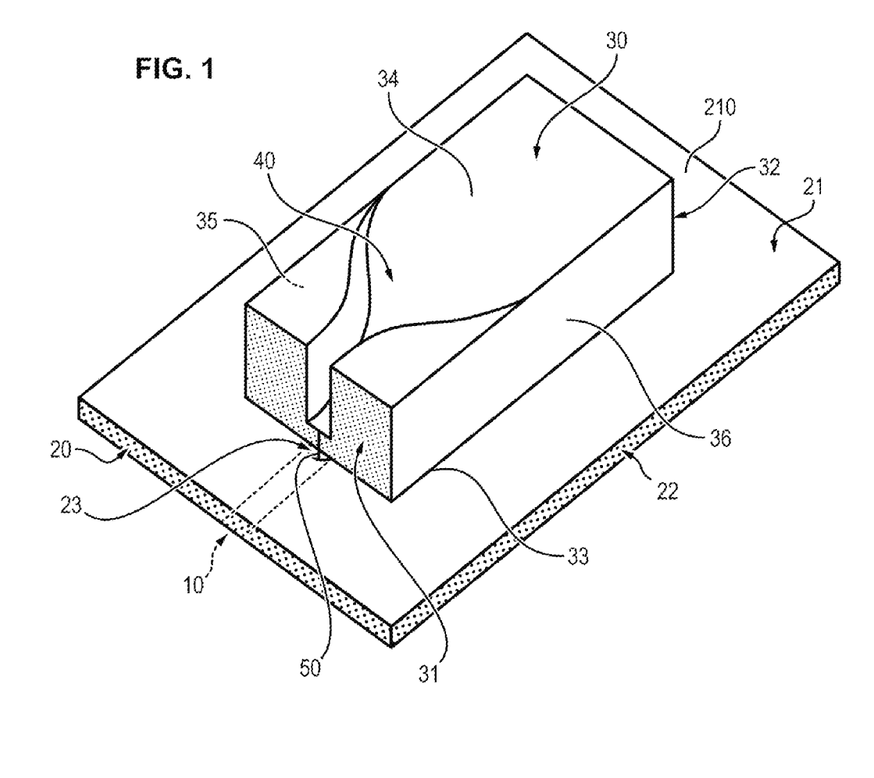
FIG. 1 illustrates a perspective view of a transition device according to a first embodiment of the invention.

FIG. 1 illustrates a transition device between a printed transmission line 10 on a dielectric substrate 20 and a rectangular waveguide 30 according to a first embodiment of the invention.

The dielectric substrate 20 includes a front face 21 including a conductive deposit 210 forming a ground plane, and a rear face 22 parallel to the front face on which the transmission line 10 is printed.

The dielectric waveguide 30 is rectangular and includes a front face 31 forming an inlet of the waveguide, a rear face 32 parallel to the front face 31 and forming an outlet of the waveguide, a lower face 33, an upper face 34 parallel to the lower face, the lower face 33 and upper face 34 extending between the front 31 and rear 32 faces.

In addition, the rectangular waveguide includes two lateral faces 35, 36 parallel to each other respectively extending between the upper face 34 and lower face 33.

The waveguide is made of dielectric material and is a solid parallelepiped block. The material of the waveguide is preferably plastic or plastic foam with electrical characteristics such that the relative permittivity $\epsilon_r$ is as close as possible to 1 and the dielectric losses tgδ very close to zero.

The waveguide is further metalized on all its faces except the front face and the rear face thereof. Thus the following are metalized: the lower face 33 and upper face 34 and the two lateral faces 35, 36. The transition device further includes a three-dimensional cavity or "taper" 40 formed in the volume of the waveguide 30 between the inlet 31 of the waveguide, further forming an inlet of the cavity, and the rear face 32 widening along a longitudinal axis (not represented) of the waveguide 30.

The three-dimensional cavity 40 may be produced in the volume of the waveguide 30, either by machining or by molding.

Advantageously, in order to couple the transmission line 10 and the waveguide 30, the device includes an electrical connection 50 which extends from the transmission line 10 along the front face of the waveguide up to the inlet 31 of the three-dimensional cavity 40.

In addition, the dielectric substrate includes a recess 23 configured for bringing the electrical connection 50 to the inlet of the cavity 40.

As will be understood the junction device is of the SMC (Surface Mounted Component) type so that it can be easily transferred onto a dielectric substrate (i.e. an integrated circuit) or onto a metal support.

FIGS. 2a, 2b, 2c and 2d respectively illustrate a bottom view, a front view, a side view and a top view of a waveguide of a transition device according to the first embodiment of the invention.

Figure 2A:
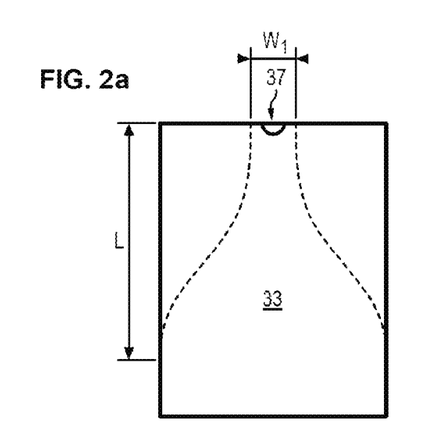
FIGS. 2a, 2b, 2c and 2d respectively illustrate a bottom view, a front view, a side view and a top view of a waveguide of a transition device according to the first embodiment of the invention.
Figure 2B:
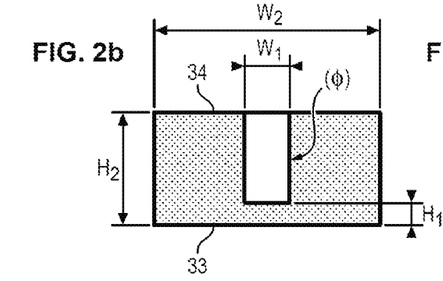

In the front view, the three-dimensional cavity presents an inlet profile φ (with vertical linear edges in FIG. 2b). In particular there is a slot arranged in the waveguide 30 (FIG. 1) of width $W_1$ at its base below which there is a thickness of dielectric material of the waveguide equal to inlet height $H_1$.

The cavity is at an inlet height $H_1$ (FIGS. 2b and 2c) of the lower face 33 (FIGS. 2a-2c) of the waveguide 30 and ends at a distance L (FIG. 2a) from the inlet of the cavity at an outlet height $H_2$ (FIG. 2b) greater than the inlet height $H_1$.

The inlet width $W_1$ (FIG. 2a) and inlet height $H_1$ values are chosen to match the geometric characteristics of a microstrip transmission line with a characteristic impedance $Z_c$ (typically 50 Ω), which would be produced on a dielectric substrate of the same dielectric material as that used for the waveguide and of a thickness equal to inlet height $H_1$, where the microstrip width would be equal to $W_1$. This choice of characteristic impedance, and consequently the choice of the dimensions $W_1$ and $H_1$, is used to ensure the conditions for a good match with the printed transmission line, itself with a characteristic impedance $Z_c$.

Subsequently the cavity expands over a length L along the longitudinal axis of the waveguide along a widening profile φ' (sinuous in FIG. 2d).

Figure 2C:
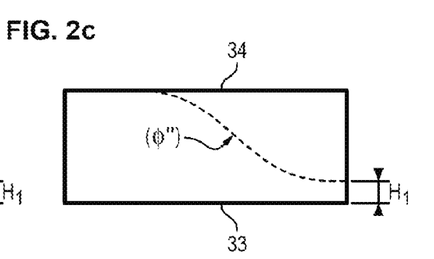
Figure 2D:
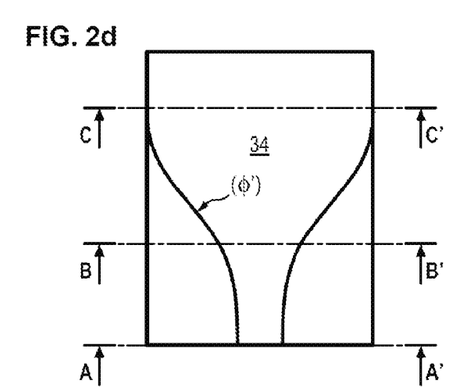

As mentioned above the inlet of the cavity is at an inlet height $H_1$ of the lower face 33 of the waveguide 30 and ends at a distance L from the inlet of the cavity at an outlet height $H_2$ (FIG. 2b) greater than the inlet height $H_1$ and presents a lateral profile φ" (sinuous in FIG. 2c). The upper face 34 (FIG. 2b, 2c, 2d) of the waveguide 30 is also indicated.

In a preferred way, the cavity 40 ends at a distance L from the inlet with a transverse section, the dimensions $W_2$ and $H_2$ (FIG. 2b) of which match those of the rectangular waveguide in which the latter is formed.

Advantageously the length L of the cavity and the appearance of the inlet φ, lateral φ" and widening φ' profiles progressively match the inlet dimensions of the cavity $W_1$, $H_1$ to its outlet dimensions $W_2$, $H_2$.

Thus, the cavity presents a height/width pair that increases along the length L of the waveguide 30.

In addition, in order to avoid any electrical contact between the electrical connection 50 and the lower face of the metalized waveguide, a local area 37 (FIG. 2a), around the electrical connection, is devoid of metalization.

Figure 3A:
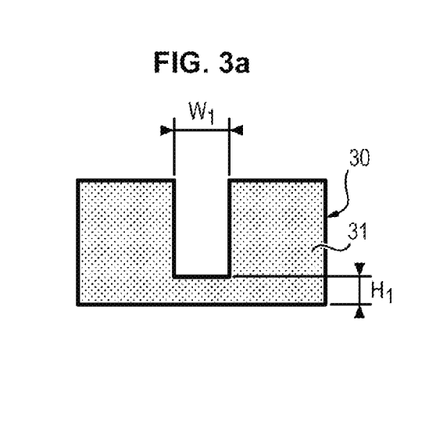
FIGS. 3a, 3b and 3c respectively illustrate a view of section AA', section BB' and section CC' of FIG. 2d.
Figure 3B:
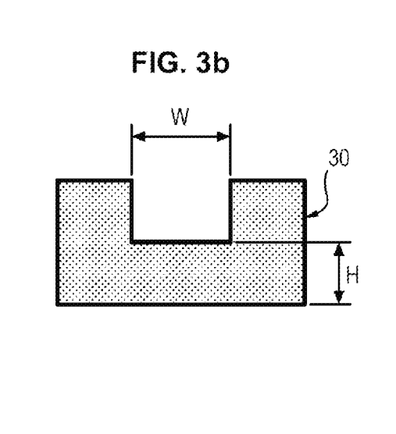
Figure 3C:
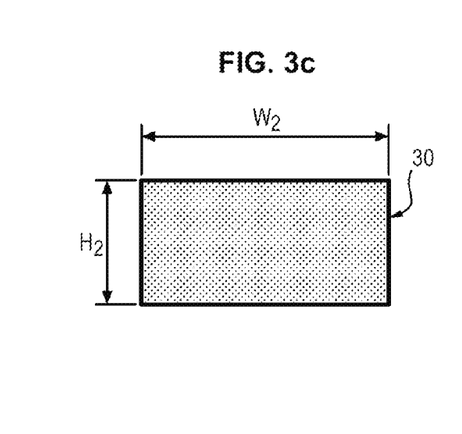

FIGS. 3a, 3b and 3c respectively illustrate a view of section AA', section BB' and section CC' in FIG. 2d which again illustrate the widening of the cavity. The width $W_1$ (FIG. 3a) at the inlet is less than the width W (FIG. 3b) taken in an intermediate sectional plane of the waveguide 30 and even less than the width $W_2$ (FIG. 3c) taken at the outlet of the cavity 40 (FIG. 1a). The front face 31 (FIG. 3a) of the waveguide 30 is also indicated.

Similarly the inlet height $H_1$ (FIG. 3a) at the inlet is less than the height H (FIG. 3b) taken in an intermediate sectional plane along the section BB' and even less than the height $H_2$ (FIG. 3c) taken at the outlet of the cavity 40. Thus as mentioned, the cavity presents a height/width pair that increases along the length L of the waveguide 30.

The inlet, widening and lateral profiles may take several forms.

Figure 4A:
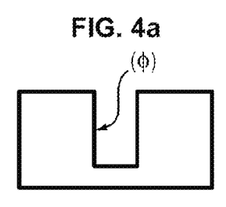
FIGS. 4a, 4b, 4c, 4d and 4e illustrate several variants of the inlet profile of a cavity of a junction device in conformity with the invention.
Figure 4B:
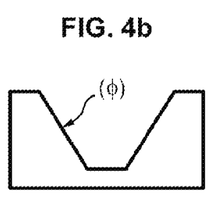
Figure 4C:
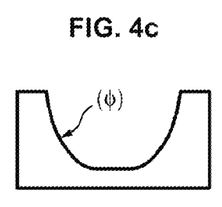
Figure 4D:
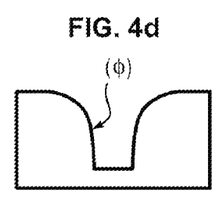
Figure 4E:
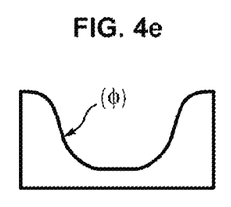

The inlet profile (φ) may have vertical linear edges (FIG. 4a), oblique linear edges (FIG. 4b), concave edges (FIG. 4c), convex edges (FIG. 4d), or sinuous edges (FIG. 4e).

Figure 5A:
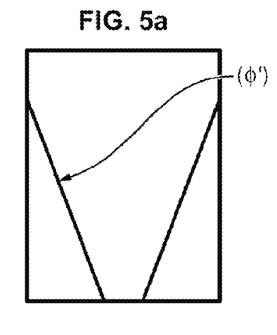
FIGS. 5a, 5b, 5c and 5d illustrate several variants of the widening profile of a cavity of a junction device in conformity with the invention.
Figure 5B:
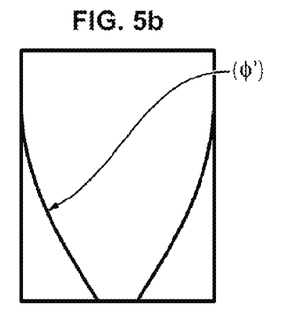
Figure 5C:
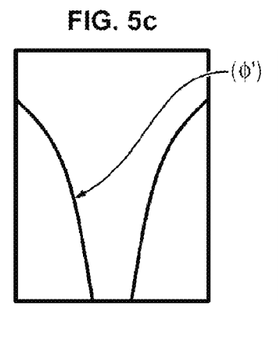
Figure 5D:
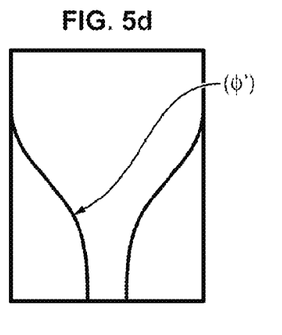

The widening profile (φ') may be linear (FIG. 5a), concave (FIG. 5b), convex (FIG. 5c) or sinuous (FIG. 5d).

Figure 6A:
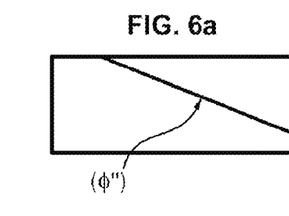
FIGS. 6a, 6b, 6c and 6d illustrate several variants of the lateral profile of a cavity of a junction device in conformity with the invention.
Figure 6B:
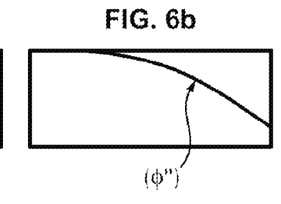
Figure 6C:
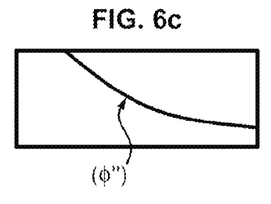
Figure 6D:
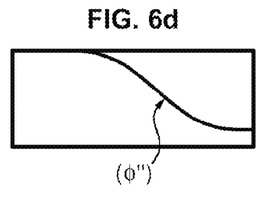

The lateral profile (φ") may be linear (FIG. 6a), concave (FIG. 6b), convex (FIG. 6c) or sinuous (FIG. 6d).

A description will now be given of several embodiments of a transition device in conformity with the invention.

Figure 7A:
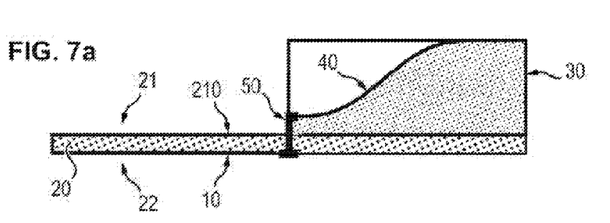
FIGS. 7a and 7b respectively illustrate a side view and a front view of the transition device according to the first embodiment of the invention.
Figure 7B:
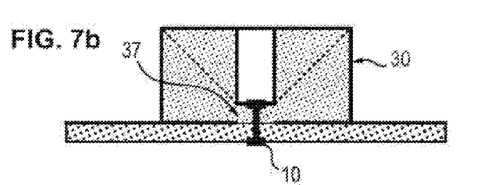

FIGS. 7a and 7b respectively illustrate a side and front view of a transition device according to the first embodiment of the invention.

According to this first embodiment the dielectric substrate 20 includes a front face 21 including a conductive deposit 210 forming a ground plane, and a rear face 22 parallel to the front face as shown in FIG. 7a on which the transmission line 10 is printed. In addition, the waveguide 30 is disposed on the ground plane 210 and the dielectric substrate includes a recess 23 configured for bringing the electrical connection 50 to the inlet of the three-dimensional cavity or "taper" 40 (FIG. 7a). In addition, the waveguide includes on its lower face a local area 37 (FIG. 7a) at the level of the electrical connection 50 (FIG. 7a) devoid of metalization in order to prevent any electrical contact between the electrical connection and the lower face of the waveguide.

Figure 8A:
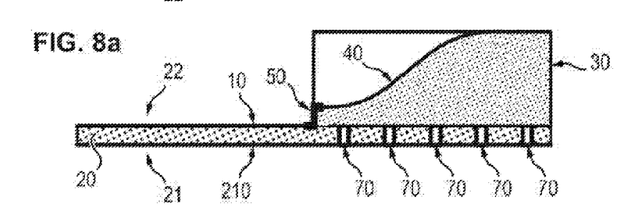
FIGS. 8a and 8b respectively illustrate a side view and a front view of the transition device according to a second embodiment of the invention.
Figure 8B:
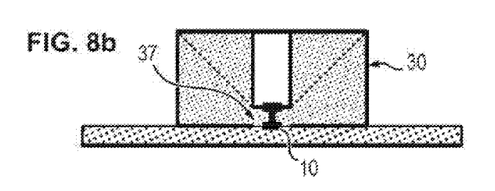

FIGS. 8a and 8b respectively illustrate a side and front view of a transition device according to a second embodiment of the invention.

According to this second embodiment, the dielectric substrate 20 includes a front face 21 including a conductive deposit 210 forming a ground plane, and a rear face 22 parallel to the front face as shown in FIG. 8a on which the transmission line 10 is printed. In addition, the waveguide 30 is disposed on the rear face of the dielectric substrate. In order to connect the lower face of the waveguide to the ground plane of the dielectric substrate, the device includes a plurality of metalized vias 70 (FIG. 8a) traversing the dielectric substrate and electrically connecting the ground plane to the lower face of the waveguide. In addition, the waveguide includes on its lower face a local area 37 (FIG. 8b) at the level of the electrical connection 50 (FIG. 8a) devoid of metalization in order to prevent any electrical contact between the electrical connection and the lower face of the waveguide. The three-dimensional cavity or "taper" 40 (FIG. 8a) is also indicated.

Figure 9A:
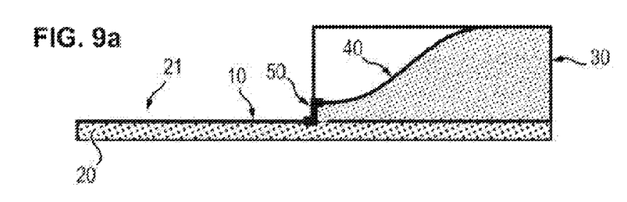
FIGS. 9a and 9b respectively illustrate a side view and a front view of the transition device according to a third embodiment of the invention.
Figure 9B:
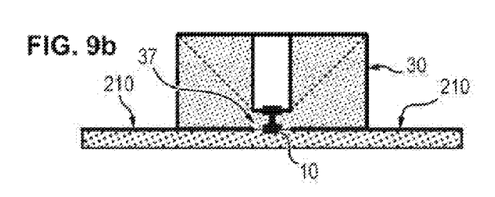

FIGS. 9a and 9b respectively illustrate a side and front view of a transition device according to a third embodiment of the invention.

According to this third embodiment, the dielectric substrate 20 includes a front face 21 as shown in FIG. 9a on which the transmission line 10 and a conductive deposit 210 (FIG. 9b) forming a ground plane in contact with the lower face of the waveguide 30 are coplanarly printed. In addition, the waveguide is disposed on the ground plane and the lower face of the waveguide includes a local area 37 (FIG. 9b) at the level of the electrical connection 50 (FIG. 9a) devoid of conductive deposit in order to prevent any electrical contact between the electrical connection 50 and the lower face of the waveguide. The three-dimensional cavity or "taper" 40 (FIG. 9a) is also indicated.

Figure 10A:
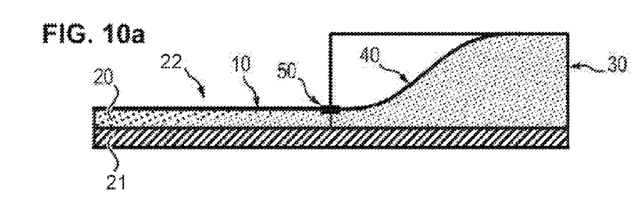
FIGS. 10a and 10b respectively illustrate a side view and a front view of the transition device according to a fourth embodiment of the invention.
Figure 10B:
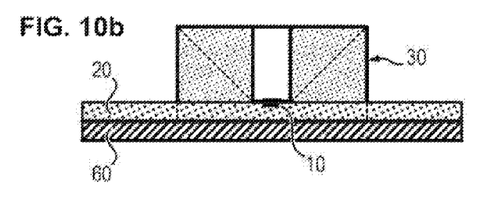

FIGS. 10a and 10b respectively illustrate a side and front view of a transition device according to a fourth embodiment of the invention.

According to this fourth embodiment, the device includes a metal support 60 (FIG. 10b) on which the waveguide is disposed. In addition, the lower face of the waveguide is connected to the metal support, a metal support on which the dielectric substrate is also disposed. In this configuration, the dielectric substrate 20 is in the extension of the waveguide 30.

In each of the embodiments described above, the electrical connection 50 (FIG. 10a) produced in the form of a metal conductor ensures the electrical connection between the end of the transmission line 10 and the inlet of the three-dimensional cavity or "taper" 40 (FIG. 10a) and is chosen for being the most transparent possible in electrical terms. It may be, for example, a wire or a very short metal strip or even, if the configuration allows it, a simple solder point. The front face 21 and rear face 22 of the substrate 20 is also indicated in FIG. 10a.

A prototype of a transition device according to the first embodiment has been developed and characterized in the X band [8-12 GHz]. In particular, performances obtained by digital simulation were compared with the developed device.

In order to be able to measure the device experimentally, it is composed of two transitions according to the first embodiment, mounted "head-to-tail" and separated by a waveguide section of given length.

The waveguide is here in a polyurethane foam material of relative permittivity $\in_r$ =1.17 and dielectric losses tgδ=0.003. For a single transition, the length L of the cavity is slightly less than 0.6 $\lambda_g$, where $\lambda_g$ is the guided wavelength of the signal in a waveguide operating in the X band, filled with foam. This length L preserves a relatively compact character for this type of transition.

Figure 11:
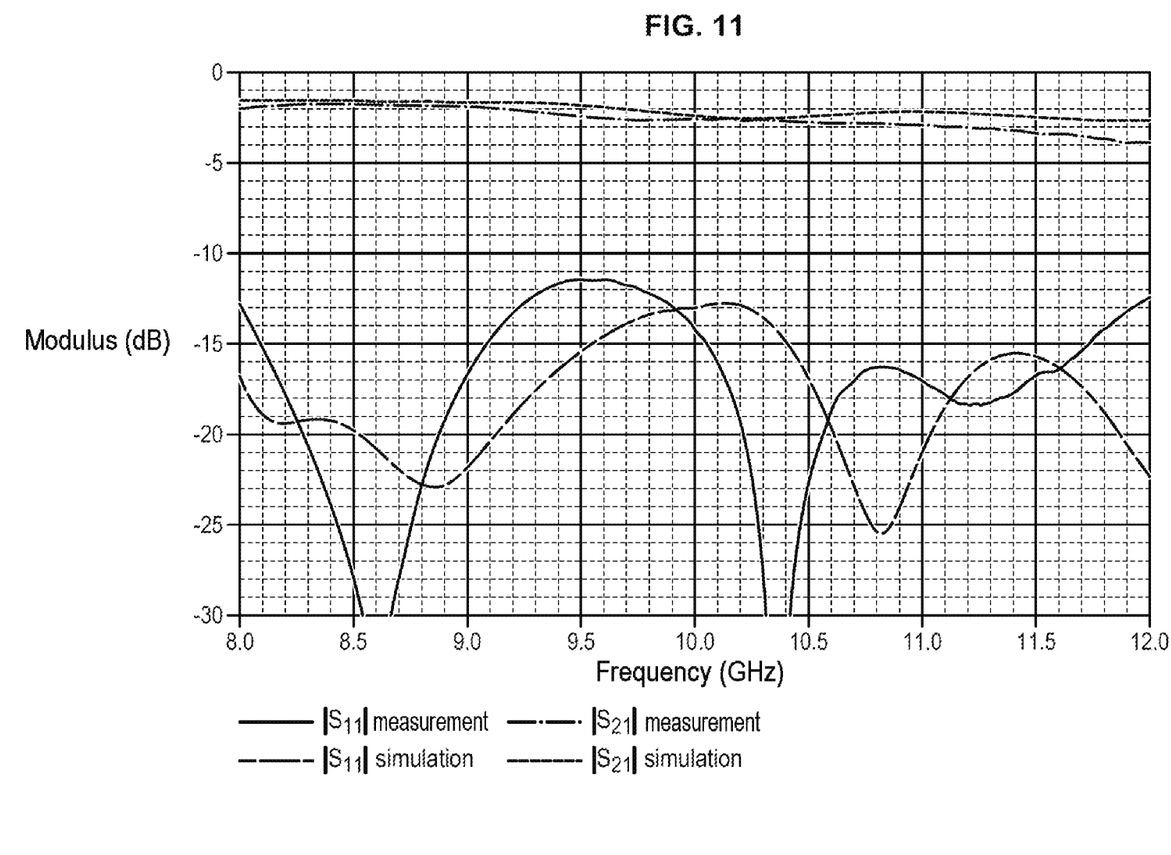
FIG. 11 illustrates the transmission and reflection coefficients of a simulated and produced prototype, this one consisting of two transition devices according to the first embodiment mounted "head-to-tail".

FIG. 11 illustrates the comparison between measurements and simulations of the transmission and reflection coefficients of the prototype operating in the X band. Specifically as shown the measured and simulated insertion loss (S21) and the measured and simulated return loss (S11) curves are plotted as loss modulus (dB) on the y axis against frequency on the x axis in a linear range between 8GHz and 12GHz. This figure demonstrates the fit between the various results from which it can be inferred that the device is well matched over a wide frequency band (i.e. a matching level of less than −10 dB over a band greater than [8-12GHz]) and that the insertion losses for the overall structure do not exceed 2.5 dB at the central frequency of 10 GHz and 4 dB at the highest frequency of 12 GHz.

These results reduced to a simple transition lead to a matching level well below −10 dB over the whole X band and insertion losses at 10 GHz well below 1 dB for an elementary transition.

The invention claimed is:

1. A transition device between a printed transmission line on a dielectric substrate and a rectangular waveguide including a front face forming an inlet of the waveguide, a rear face parallel to the front face and forming an outlet of the waveguide, a lower face, an upper face parallel to the lower face, the upper and lower faces extending between the front and rear faces, the waveguide being a block of dielectric material, said lower face and upper face being fully metalized, the transition device including:
   a three-dimensional cavity formed in the volume of the waveguide between the inlet of the waveguide, further forming the inlet of the cavity, and the rear face, the cavity being at an inlet height from the lower face of the waveguide and ending at a distance from the inlet of the cavity at an outlet height greater than the inlet height;
   an electrical connection extending from the transmission line along the front face of the waveguide up to the inlet of the three-dimensional cavity;
   wherein the cavity presents an inlet width and an outlet width greater than the inlet width so that a widening of the cavity results in both a height and a width of the cavity increasing along the waveguide.

2. The transition device of claim 1, in which the three-dimensional cavity includes a lateral profile being one of linear, concave, convex, and sinuous, said lateral profile being characteristic of the variation in the height of the cavity between the inlet height and the outlet height.

3. The transition device of claim 1, in which the dielectric substrate includes a front face including a conductive deposit forming a ground plane, and a rear face parallel to the front face on which the transmission line is printed, the waveguide being disposed on the ground plane, the dielectric substrate including a recess configured for bringing the electrical connection to the inlet of the cavity, the waveguide including on the lower face thereof a local area around the electrical connection devoid of metalization in order to prevent any electrical contact between the electrical connection and the lower face of the waveguide.

4. The transition device of claim 1, in which the dielectric substrate includes a front face including a conductive deposit forming a ground plane, and a rear face parallel to the front face on which the transmission line is printed, the waveguide being disposed on the rear face, the lower face of the waveguide being connected to the ground plane via a plurality of metalized vias traversing the dielectric substrate, the lower face of the waveguide including a local area around the electrical connection devoid of metalization in order to prevent any electrical contact between the electrical connection and the lower face of the waveguide.

5. The transition device of claim 1, in which the dielectric substrate includes a front face on which are printed the transmission line and a conductive deposit forming a ground plane in contact with the lower face of the waveguide, the ground plane and the transmission line being coplanar, the electrical connection being connected to the end of the transmission line, the lower face of the waveguide including a local area around the electrical connection devoid of metalization in order to prevent any electrical contact between the electrical connection and the lower face of the waveguide.

6. The transition device of claim 1, including a metal support on which the waveguide is disposed, the lower face of the waveguide being connected to said metal support, the dielectric substrate also disposed on said metal support, the conductive element being connected to the inlet of the waveguide.

7. The transition device of claim 1, in which the three-dimensional cavity includes a U-shaped inlet profile at the inlet of the waveguide.

8. The transition device of claim 1, in which the three-dimensional cavity includes an inlet profile with one of oblique linear edges, concave edges, convex edges, and sinuous edges.

9. The transition device of claim 1, in which the three-dimensional cavity presents a widening profile being one of linear, concave, convex, and sinuous, said widening profile being characteristic of the variation in the width of the cavity between the inlet width and the outlet width.

* * * * *